(12) United States Patent
Widmann et al.

(10) Patent No.: US 6,515,319 B2
(45) Date of Patent: Feb. 4, 2003

(54) FIELD-EFFECT-CONTROLLED TRANSISTOR AND METHOD FOR FABRICATING THE TRANSISTOR

(75) Inventors: Dietrich Widmann, deceased, late of Unterhaching (DE), by Helga Widmann, heir; Armin Wieder, Starnberg (DE); Justus Kuhn, München (DE); Jens Lüpke, München (DE); Jochen Müller, München (DE); Peter Pochmüller, München (DE); Michael Schittenhelm, Poing (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/861,431

(22) Filed: May 18, 2001

(65) Prior Publication Data

US 2002/0014669 A1 Feb. 7, 2002

Related U.S. Application Data

(63) Continuation of application No. PCT/DE99/03674, filed on Nov. 18, 1999.

(30) Foreign Application Priority Data

Nov. 18, 1998 (DE) .......................................... 198 53 268

(51) Int. Cl.$^7$ ............................................. H01L 31/119
(52) U.S. Cl. ....................... 257/288; 257/217; 257/262; 257/213; 257/218

(58) Field of Search ................................. 257/217, 262, 257/288, 218, 213

(56) References Cited

U.S. PATENT DOCUMENTS

| 4,979,014 | A | | 12/1990 | Hieda et al. | |
|---|---|---|---|---|---|
| 5,264,716 | A | * | 11/1993 | Kenney | 257/301 |
| 5,539,229 | A | * | 7/1996 | Noble et al. | 257/301 |
| 5,563,082 | A | | 10/1996 | Mukai | |
| 5,753,947 | A | * | 5/1998 | Gonzalez | 257/296 |
| 5,930,107 | A | * | 7/1999 | Rajeevakumar | 257/302 |
| 6,222,254 | B1 | * | 4/2001 | Liang et al. | 257/327 |
| 6,433,371 | B1 | * | 8/2002 | Scholer et al. | 257/288 |
| 6,433,372 | B1 | * | 8/2002 | Adler et al. | 257/288 |

FOREIGN PATENT DOCUMENTS

| EP | 0 510 667 A1 | 10/1992 |
|---|---|---|
| JP | 08-139325 | 5/1996 |

* cited by examiner

*Primary Examiner*—George C. Eckert, II
*Assistant Examiner*—Eugene Lee
(74) *Attorney, Agent, or Firm*—Laurence A. Greenberg; Werner H. Stemer; Gregory L. Mayback

(57) ABSTRACT

An active surface with a source area, a channel area and a drain area is provided in a semiconductor substrate. Each of the areas lie adjacent to a main surface of the semiconductor substrate. At least one trench is provided in the main surface of the semiconductor substrate. The trench is adjacent to the channel area and is situated in the gate electrode part. The gate electrode preferably has two opposite parts which are each adjacent to the channel area. The transistor is produced using standard process steps.

6 Claims, 4 Drawing Sheets

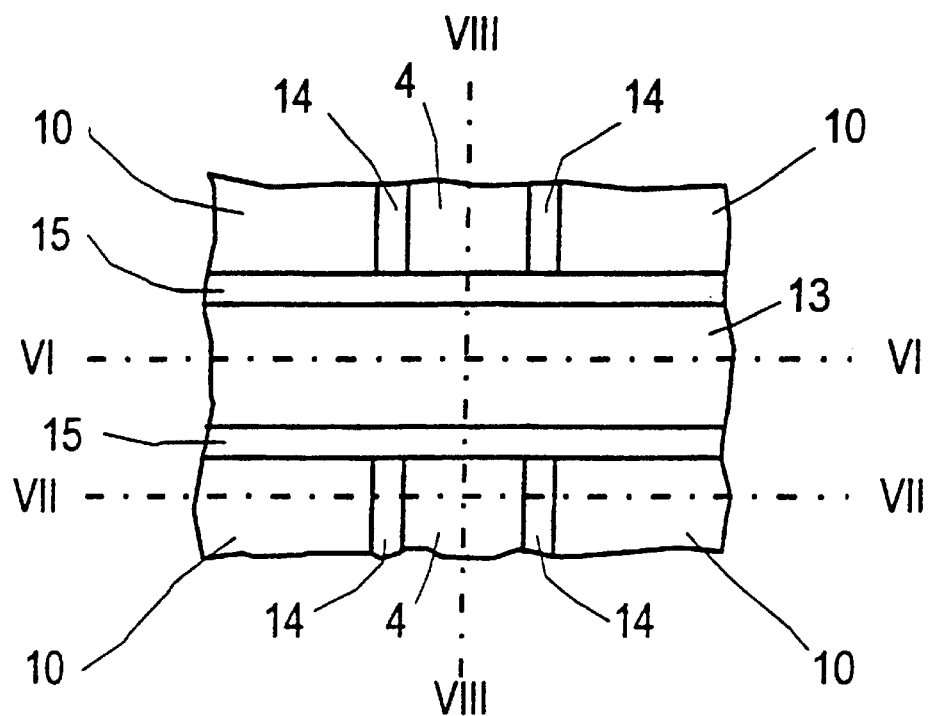
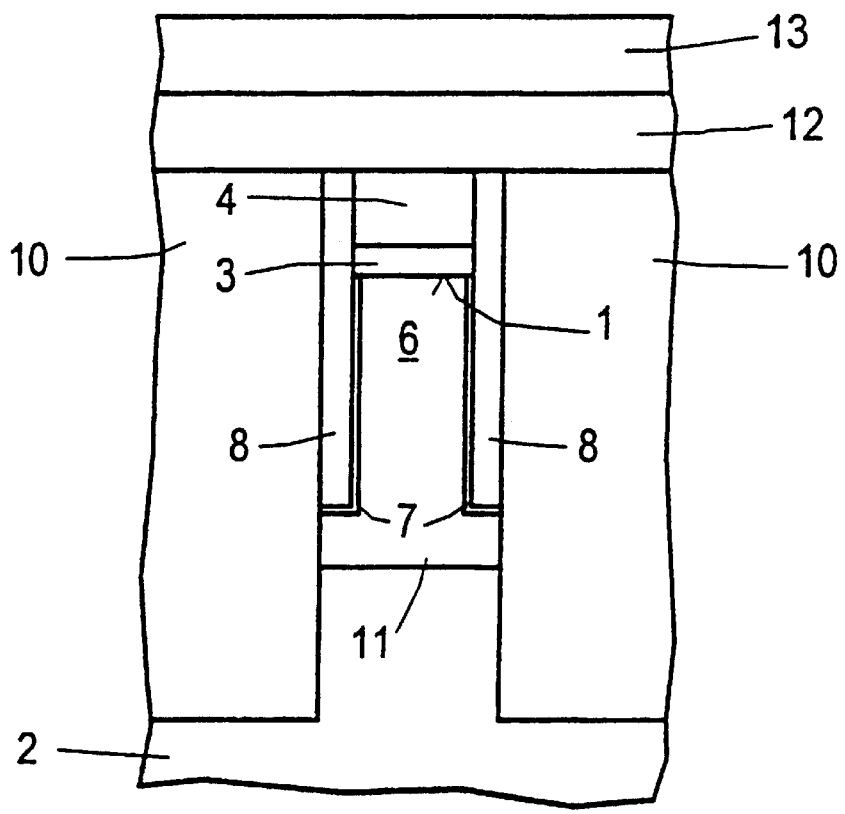

FIELD-EFFECT-CONTROLLED TRANSISTOR AND METHOD FOR FABRICATING THE TRANSISTOR

CROSS-REFERENCE TO RELATED APPLICATION

This application is a continuation of copending International application Ser. No. PCT/DE99/03674, filed Nov. 18, 1999, which designated the United States.

BACKGROUND OF THE INVENTION

FIELD OF THE INVENTION

The invention relates to a field-effect-controlled transistor which is functional even with channel lengths of less than 50 nm.

Planar MOS and junction transistors come up against their functional limits at a channel length of about 50 nm. Various transistor structures have been proposed for the gate length range below 50 nm (see, for example, H. Wong et al., IEDM 97, page 427 et seq.). One proposal here is for a MOS transistor to be provided with two gate electrodes which are arranged on mutually opposite sides of the channel region and thus control a current flow along two surfaces of the channel region. Here there are both vertical structures, in which a source region, the channel region and a drain region are arranged in the vertical direction with regard to a main surface of a silicon wafer and form a stack projecting above the main surface, and planar structures, in which the source region, the channel region and the drain region are arranged parallel to the main surface of the silicon wafer.

H. Wong et al., IEDM 97, page 427 et seq., have proposed realizing a planar MOS transistor on an SOI substrate, in which one gate electrode is arranged above, and one gate electrode below, the channel region. In order to fabricate the transistor, it is proposed to apply to a silicon substrate a thick silicon oxide layer, a first silicon nitride layer, a first thin silicon oxide layer, a spacer layer made of amorphous silicon, a second thin silicon oxide layer and a second silicon nitride layer and to pattern them in such a way that the surface of the thick silicon oxide layer is uncovered in the regions for source and drain. Furthermore, in one of the source/drain regions, a window is opened in the thick silicon oxide layer down to the surface of the silicon substrate. The spacer layer made of amorphous silicon is removed in the region of the gate stack. Afterward, by means of selective epitaxy proceeding from the uncovered surface of the silicon substrate, monocrystalline silicon is grown in the region of the source/drain regions and of the channel region. Removal of the patterned first silicon nitride layer and second silicon nitride layer and deposition of doped polysilicon result in the formation of the two gate electrodes above and below the channel region which grew in the course of the selective epitaxy. This method is not compatible with standard steps of semiconductor process technology.

D. Hisamoto et al., IEDM 89, pages 833–36, have proposed a planar MOS transistor having a source region, a channel region and a drain region in a silicon ridge which is insulated by a field oxide region from a silicon substrate arranged underneath. A gate electrode overlaps the silicon ridge in the region of the channel region and thus controls a channel current along both sidewalls of the silicon ridge. The current direction runs parallel to the main surface of the silicon substrate. In order to fabricate this transistor, it is proposed to pattern the silicon ridge on the surface of a silicon substrate, the ridge being covered with a silicon nitride layer and the sidewalls of the ridge being provided with silicon nitride spacers. The surface of the silicon substrate is subsequently undercut under the silicon nitride spacers. The field oxide region is formed by local oxidation of the surface of the silicon substrate. In this case, the oxidation is continued until field oxide regions produced on both sides of the ridge meet through the bird beaks that form below the ridge. This fabrication process is also not compatible with standard steps of semiconductor process technology.

SUMMARY OF THE INVENTION

The object of the present invention is to provide a field-effect-controlled transistor which overcomes the above-noted deficiencies and disadvantages of the prior art devices of this general kind, and which is functional with gate lengths of less than 50 nm and which can be fabricated using standard steps of semiconductor process technology. It is a further object of the invention to specify a method of fabricating a transistor of this type.

With the above and other objects in view there is provided, in accordance with the invention, a field-effect-controlled transistor, comprising:

a semiconductor substrate having a main surface;

an active region with sidewalls, the active region having a source region, a drain region, and a channel region, each adjoining the main surface of the semiconductor substrate;

the main surface having a first trench and a second trench formed therein adjoining mutually opposite sidewalls of the active region;

a gate electrode formed with two conductive spacers on opposite sides of the active region and at the channel region and a patterned conductive layer connecting the conductive spacers;

an insulation structure filling the first trench and the second trench, with the conductive spacers lying between the active region and the insulation structure, and the conductive layer extending across the filled trenches; and insulating fillings disposed in interspaces formed between two other mutually opposite sides of the active region and the insulation structure, the insulation fillings being disposed at the source region and the drain region and outside the patterned conductive layer.

The field-effect-controlled transistor is implemented in a semiconductor substrate. There is provided in the semiconductor substrate an active region having a source region, a channel region and a drain region, which each adjoin a main surface of the semiconductor substrate, so that a current flows between source region and drain region parallel to the main surface of the semiconductor substrate. At least one trench is provided in the main surface of the semiconductor substrate, which trench adjoins the channel region and in which trench a part of a gate electrode is arranged. In the transistor, a part of the gate electrode reaches into the depth of the semiconductor substrate, so that the gate electrode can be used to control a current which flows parallel to the main surface of the substrate in a sidewall of the channel region which intersects the main surface of the substrate. The effective channel width is thus independent of the width of the channel region at the main surface of the semiconductor substrate.

The transistor can be realized not only as a MOS transistor but also as a junction transistor. In the case of a MOS transistor, the surface of the channel region is provided with a gate dielectric at least in the region of the trench.

With regard to integration in standard silicon process technology, it is advantageous to use a semiconductor substrate which has monocrystalline silicon at least in the region of the main surface. In particular, a monocrystalline silicon wafer, the monocrystalline silicon layer of an SOI substrate, an SiGe substrate or an SiC substrate are suitable as semiconductor substrate.

Preferably, parts of the gate electrode are in each case arranged on mutually opposite sidewalls of the channel region, so that the transistor effectively has two mutually opposite gate electrode parts. These parts are respectively arranged in a first trench and a second trench. The provision of two gate electrode parts means that inversion channels are controlled on the mutually opposite sidewalls of the channel region. As a result, the drain voltage punch-through to the channel region is reduced, so that the limiting "drain induced barrier lowering" known from the literature is practically ineffectual. Furthermore, the disturbing influence of the substrate voltage on the channel region is reduced by virtue of the provision of two gate electrode parts.

In accordance with an added feature of the invention, a gate dielectric is formed on the surface of the active region, at least in a region of the first and second trenches.

In accordance with an additional feature of the invention, an extent of the source region and of the drain region perpendicularly to the main surface is less than or equal to a depth of the trench. In other words, the extent of the source region and of the drain region perpendicularly to the main surface of the semiconductor substrate is less than or equal to the depth of the trench or the depth of the trenches. As a result, the area over which a conductive inversion channel forms is enlarged, so that the current yield is multiplied relative to planar arrangements. Moreover, the transistor transconductance, which is essential for the driving of the transistor, is thereby multiplied.

Preferably, the dimension of the gate electrode parallel to the main surface is restricted to the dimension of the channel region, thereby minimizing the drain-gate overlap capacitance. As a result, parasitic capacitances are minimized and an increased transistor transconductance is obtained, which is advantageous for fast switching behavior and a good radio-frequency behavior ranging into the GHz range.

In order to insulate the transistor within an integrated circuit, it is advantageous to provide an insulation structure which surrounds the active region and the trench or the trenches.

With the above and other objects in view there is provided, in accordance with the invention, a method of fabricating a field-effect-controlled transistor as outlined above. The novel method comprises the following steps:

producing a first trench and a second trench in a main surface of a semiconductor substrate, the trenches laterally defining an active region having a source region, a channel region, and a drain region, each adjoining the main surface of the semiconductor substrate;

depositing a first conductive layer, and forming from the first conductive layer, by anisotropic etching, conductive spacers on two mutually opposite sides of the active region;

producing an insulation structure surrounding the active region and the conductive spacers;

depositing a second conductive layer connected to the conductive spacers;

forming a gate electrode by patterning the second conductive layer and the conductive spacers; and producing an interspace during the patterning of the conductive spacers at the source region and the drain region between the insulation structure and the active region, and filling the interspace with insulating material.

In accordance with a concomitant feature of the invention, he source region and the drain region are formed by implantation in a self-aligned manner with respect to the second conductive layer and the insulation structure.

In other words, in order to fabricate the transistor, a trench is produced in the main surface of the semiconductor substrate, which trench laterally defines the active region. A gate electrode which is partly arranged in the trench is then formed.

In order to fabricate the transistor as a MOS transistor, a gate dielectric is produced on the surface of the channel region.

In order to form the gate electrode in a self-aligning manner, a first conductive layer is deposited, from which layer, by means of anisotropic etching, conductive spacers are formed on the sidewalls of the active region. An insulation structure surrounding the active region and the conductive spacers is subsequently produced. The surface of the conductive spacers parallel to the main surface of the semiconductor substrate is uncovered. A second conductive layer is deposited, which is connected to the conductive spacers via the uncovered surface thereof. The gate electrode is formed by patterning the second conductive layer and the conductive spacers. In particular, doped polycrystalline or amorphous silicon, metal silicide and/or metal is suitable as material for the conductive layers. The patterning in order to complete the gate electrode is preferably effected by means of masked etching. The mask used in the process defines the gate length. By using a fine patterning step, for example electron beam lithography, an imprint method, or by employing a spacer technique, it is possible here to obtain gate lengths of less than 50 nm, in particular from 10 to 50 nm.

The source/drain regions are preferably fabricated in a self-aligned manner with respect to the gate electrode by means of implantation.

The trench preferably has a cross section corresponding to the cross section of the insulation structure and the gate electrode. In this case, the insulation structure is formed for example by deposition of an insulating layer, which completely fills the trench, and chemical mechanical polishing.

Other features which are considered as characteristic for the invention are set forth in the appended claims.

Although the invention is illustrated and described herein as embodied in a field-effect-controlled transistor and method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 5 is a plan view of the semiconductor substrate after the formation of an insulation structure, the formation of a gate electrode and the filling of interspaces between the source region and the drain region and the insulation structure with insulation material;

FIG. 6 is a section taken along the line VI—VI in FIG. 5;

Figure 1:
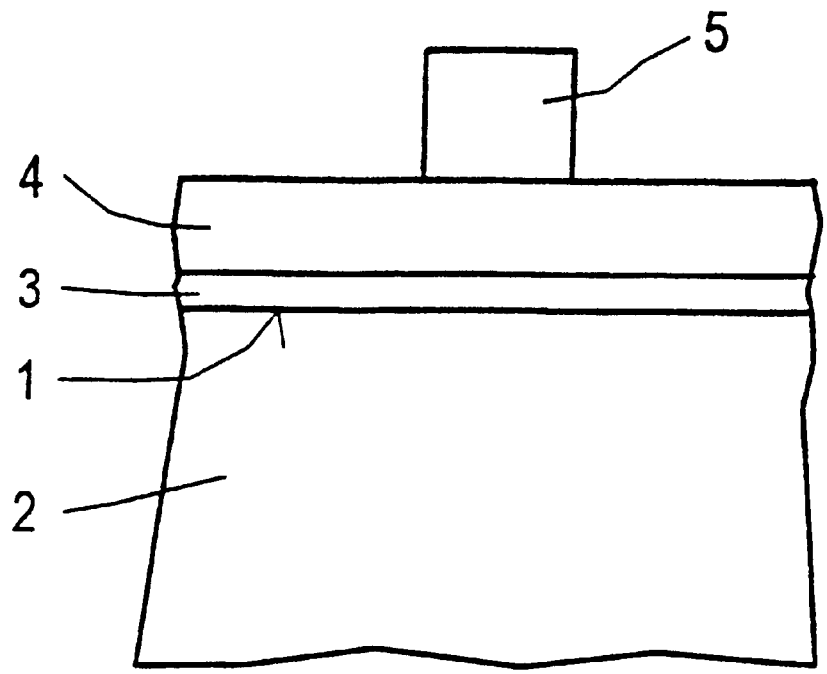
FIG. 1 is a partial section view through a semiconductor substrate, after the production of a first silicon oxide layer and a second silicon oxide layer and a mask which defines an active region.
Figure 2:
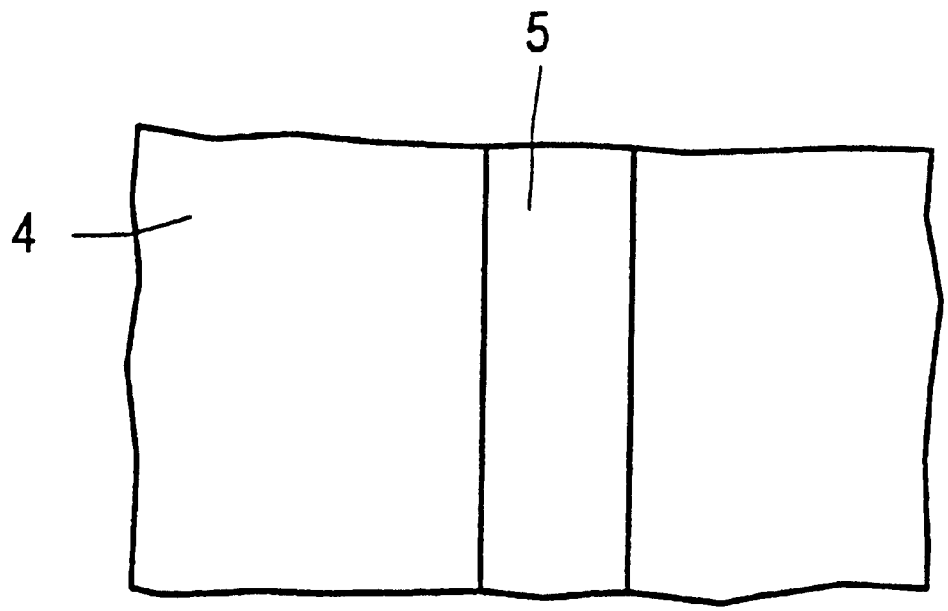
FIG. 2 is a plan view of the structure shown in FIG. 1.

DESCRIPTION OF THE PREFERRED EMBODIMENTS:

Referring now to the figures of the drawing in detail and first, particularly, to FIG. 1 thereof, there is seen a main surface 1 of a semiconductor substrate 2 made of p-doped is monocrystalline silicon having a dopant concentration of $10^{15}$ cm$^{-3}$. A first silicon oxide layer 3 is applied by means of thermal oxidation. The first silicon oxide layer 3 has a thickness of 5 nm. A first silicon nitride layer 4, which has a thickness of 20 nm, is deposited onto the first silicon oxide layer 3. A mask 5 is produced on the surface of the first silicon nitride layer 4, said mask defining an active region surrounded by a trench (see FIG. 1 and FIG. 2). The mask 5 has an essentially rectangular cross section parallel to the main surface 1 which has dimensions of 40 nm×500 nm. The first silicon nitride layer 4, the first silicon oxide layer 3 and the semiconductor substrate 2 are etched by means of anisotropic etching, an active region 6 surrounded by a trench being formed in the semiconductor substrate 2 (see FIG. 3). $CF_4$ and $H_2$ are used as etching gases. The etching is effected down to a depth of 500 nm below the main surface 1.

By means of thermal oxidation, a gate dielectric 7 made of $SiO_2$ is formed to a layer thickness of 3 nm on the sidewalls of the active region 6.

Figure 3:
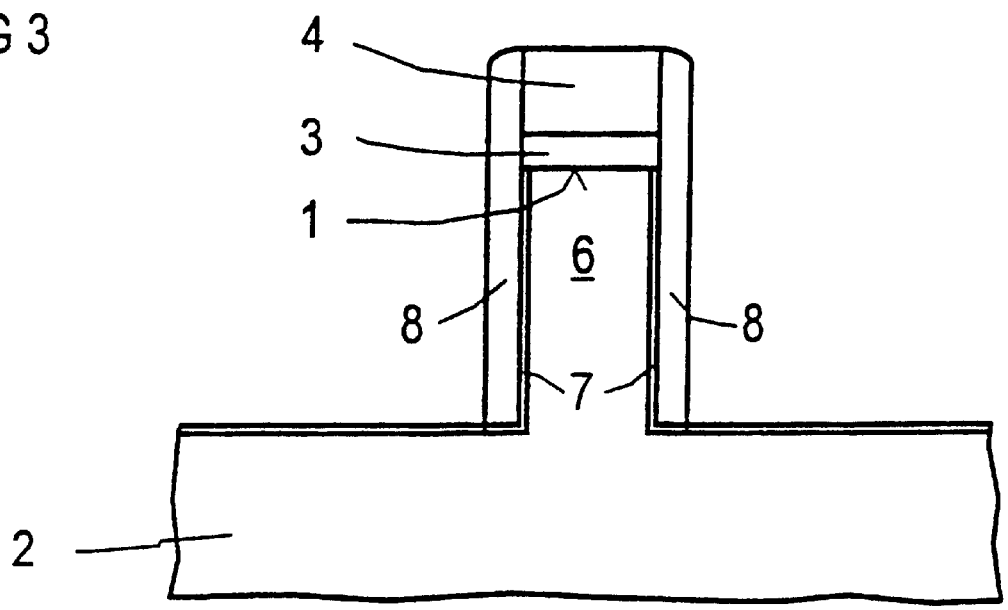
FIG. 3 is a section through the semiconductor substrate after the patterning of the active region in the semiconductor substrate, after the formation of a gate dielectric and after the production of conductive spacers on the sidewalls of the active region.

By depositing a first conductive layer made of doped polysilicon and etching back the first conductive layer, conductive spacers 8 made of doped polysilicon are formed on the sidewalls of the active region 6 (see FIG. 3). The conductive spacers 8 annularly surround the active region 6.

Figure 4:
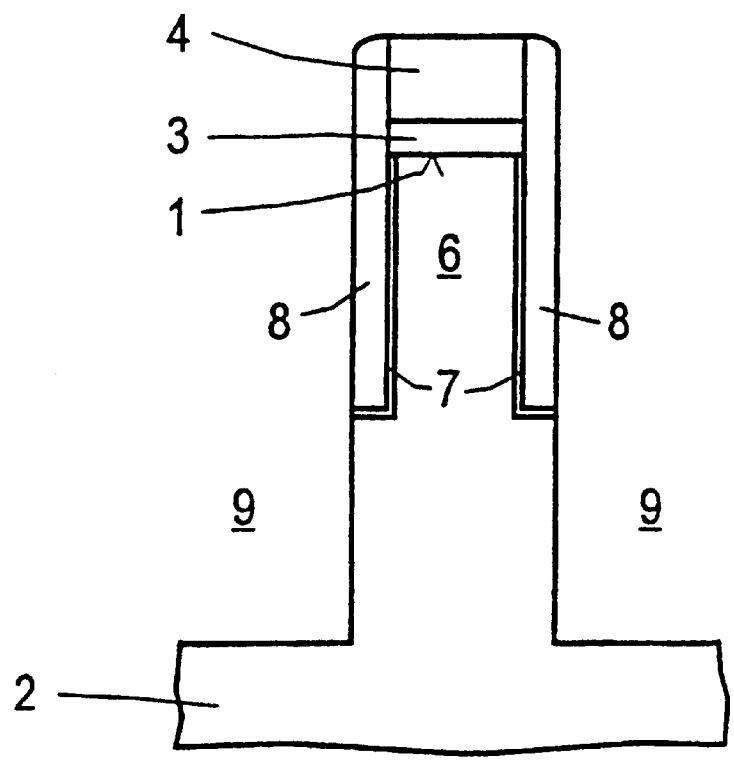
FIG. 4 is a section trough the semiconductor substrate after further etching into the semiconductor substrate.

In a further anisotropic etching process using $SiF_4$ and $H_2$, uncovered parts of the gate dielectric 7 are removed. Afterward, anisotropic etching using $CF_4$ is carried out in order to etch into the semiconductor substrate 2, so that an insulation trench 9 is produced laterally with respect to the active region 6 and the conductive spacers 8, said trench having a depth of 1 μm relative to the main surface 1 (see FIG. 4).

The insulation trenches are filled by depositing a second $SiO_2$ layer. By means of subsequent chemical mechanical polishing during which the first silicon nitride layer 4 acts as an etching stop, an insulation structure 10 is formed from the second silicon oxide layer, said structure filling the insulation trenches 9 (see FIG. 6).

By means of implantation with boron, a channel doping 11 having a dopant concentration of $5\times10^{17}$ cm$^{-3}$ is produced in the active region 6.

Figure 7:
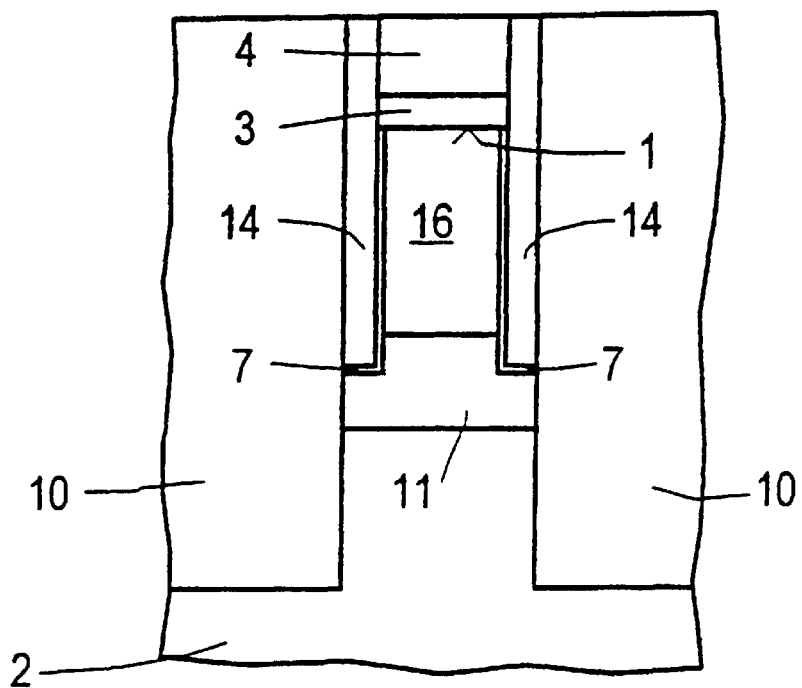
FIG. 7 is a section taken along the line VII—VII in FIG. 5.

A second conductive layer 12 and a second silicon nitride layer 13 are deposited over the whole area and patterned with the aid of a mask (not illustrated). The patterned second conductive layer 12 and the patterned second $Si_3N_4$ layer 13 have a strip-type cross section which runs transversely with respect to the longitudinal extent of the active region 6 and, parallel to the longitudinal extent of the active region 6, has a width of 40 nm. During the patterning of the second conductive layer 12, the uncovered regions of the conductive spacers 8 are likewise removed. The patterning is effected by anisotropic etching using $SiF_4$ and $H_2$. By depositing a third silicon oxide layer and etching back the third silicon oxide layer, interspaces between the active region 6 and the insulation structure 10, which are produced outside the patterned second conductive layer 12 during the removal of the conductive spacers 8, are provided with an insulation filling 14 (see FIG. 7).

Figure 8:
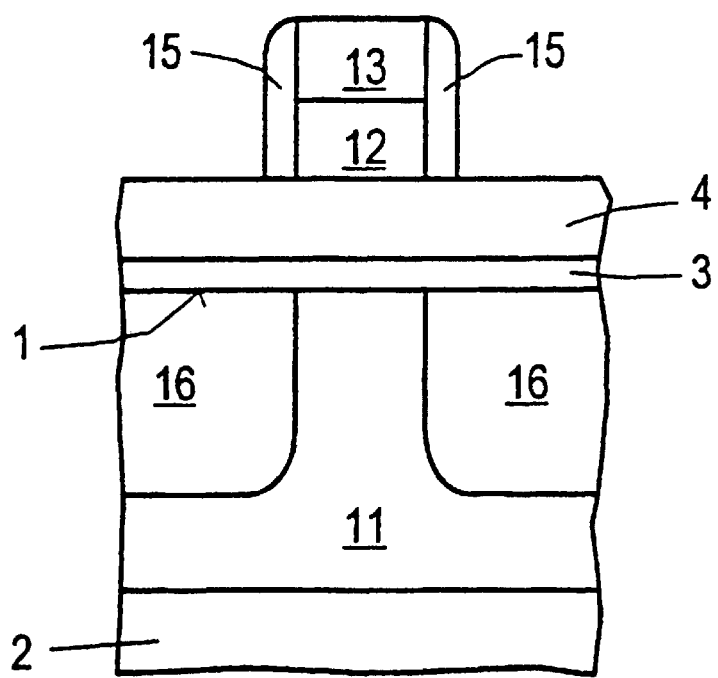
FIG. 8 is a section taken along the line VIII—VIII in FIG. 5.

The sidewalls of the patterned second conductive layer 12 and of the patterned second silicon nitride layer 13 are provided with silicon nitride spacers 15 by depositing a third silicon nitride layer and anisotropically etching back the third silicon nitride layer (see FIG. 5 and FIG. 8). By means of implantation with As with an energy of 50 keV and a dose of $2\times10^{15}$ cm$^{-2}$, the source/drain regions 16 are produced in a self-aligned manner with respect of the patterned second conductive layer 12 (see FIG. 7 and FIG. 8). In this case, the depth of the source/drain regions 16 below the main surface 1 is less than the depth to which the conductive spacers 8 extend.

The conductive spacers 8 are connected to one another via the patterned second conductive layer 12. The conductive spacers 8 and that part of the second patterned conductive layer 12 which connects them act as gate electrode. Since the conductive spacers 8 extend into the semiconductor substrate 1 more deeply than the source/drain regions 16, a conductive inversion channel forms in the event of corresponding driving of the gate electrode over the entire depth of the source/drain regions 16 between the source/drain regions 16. Consequently, the region of the active region 6 between the source/drain regions 16 acts as channel region over the entire depth.

In order to complete the transistor, a multilayer metallization is produced according to conventional methods (not illustrated).

The exemplary embodiment concerns an n-channel transistor; the invention can equally be embodied as a p-channel transistor. Furthermore, the conductive layers can be formed from different conductive material, in particular a metal silicide or metal. Furthermore, the gate dielectric 7 may also be situated in the region of the main surface 1 of the active region, so that a conductive inversion channel can also form along the main surface. In this case, the first silicon oxide layer and the first silicon nitride layer between the active region 6 and the second conductive layer 12 are obviated. If technologically necessary, the source/drain regions 16 can be formed with an LDD profile.

We claim:

1. A field-effect-controlled transistor, comprising:

a semiconductor substrate having a main surface;

an active region with sidewalls, said active region having a source region, a drain region, and a channel region, each adjoining said main surface of said semiconductor substrate;

said main surface having a first trench and a second trench formed therein adjoining mutually opposite sidewalls of said active region;

a gate electrode formed with two conductive spacers on opposite sides of said active region and at said channel region and a patterned conductive layer connecting said conductive spacers;

an insulation structure filling said first trench and said second trench, with said conductive spacers lying between said active region and said insulation structure, and said conductive layer extending across said filled trenches; and insulating fillings disposed in interspaces formed between two other mutually opposite sides of said active region and said insulation structure, said insulation fillings being disposed at said source region and said drain region and outside said patterned conductive layer.

2. The field-effect-controlled transistor according to claim 1, which comprises a gate dielectric on said surface of said active region, at least in a region of said first and second trenches.

3. The field-effect-controlled transistor according to claim 1, wherein an extent of a source region and of a drain region perpendicularly to said main surface is less than or equal to a depth of said trench.

4. The field-effect-controlled transistor according to claim 1, wherein said insulation structure surrounds said active region.

5. A method of fabricating a field-effect-controlled transistor, the method which comprises:

producing a first trench and a second trench in a main surface of a semiconductor substrate, the trenches laterally defining an active region having a source region, a channel region, and a drain region, each adjoining the main surface of the semiconductor substrate;

depositing a first conductive layer, and forming from the first conductive layer, by anisotropic etching, conductive spacers on two mutually opposite sides of the active region;

producing an insulation structure surrounding the active region and the conductive spacers;

depositing a second conductive layer connected to the conductive spacers;

forming a gate electrode by patterning the second conductive layer and the conductive spacers; and producing an interspace during the patterning of the conductive spacers at the source region and the drain region between the insulation structure and the active region, and filling the interspace with insulating material.

6. The method according to claim 5, which comprises forming the source region and the drain region by implantation in a self-aligned manner with respect to the second conductive layer and the insulation structure.

* * * * *